United States Patent [19]
Isherwood et al.

[11] Patent Number: 4,701,747
[45] Date of Patent: Oct. 20, 1987

[54] DATA INPUT SYSTEM INCLUDING A KEYBOARD HAVING NO MOVING PARTS

[75] Inventors: Jonathan M. Isherwood; Andrew R. Gibbs, both of Leamington Spa, Great Britain

[73] Assignee: NCR Corporation, Dayton, Ohio

[21] Appl. No.: 812,425

[22] Filed: Dec. 23, 1985

[30] Foreign Application Priority Data

Apr. 16, 1985 [GB] United Kingdom ................. 8509688

[51] Int. Cl.⁴ .......................................... H03K 17/969
[52] U.S. Cl. ............................. 340/365 P; 340/365 S; 250/221
[58] Field of Search ............ 340/365 P, 365 E, 365 S, 340/365 VL, 365 C; 178/18; 250/227, 229, 221

[56] References Cited

U.S. PATENT DOCUMENTS

| | | | |
|---|---|---|---|
| 3,372,789 | 3/1968 | Thiele et al. | 340/365 P |
| 3,617,627 | 11/1971 | McLean | 340/365 E |
| 3,717,870 | 2/1973 | Mathews et al. | 340/365 VL |
| 3,860,754 | 1/1975 | Johnson et al. | 178/18 |
| 3,868,681 | 2/1975 | Ohyama et al. | 340/365 S |
| 4,017,848 | 4/1977 | Tannas | 340/365 VL |
| 4,198,623 | 4/1980 | Misek et al. | 340/365 P |
| 4,254,333 | 3/1981 | Bergstrom | 340/365 P |
| 4,543,564 | 9/1985 | Audoin et al. | 340/365 S |
| 4,629,884 | 12/1986 | Bergstrom | 250/227 |

FOREIGN PATENT DOCUMENTS

| | | | |
|---|---|---|---|
| 2080990 | 2/1982 | United Kingdom | 340/365 S |
| 2090979 | 7/1982 | United Kingdom | 340/365 C |

OTHER PUBLICATIONS

E. G. Uberbacher, "Fiber Optic Illuminated Switch", *IBM Technical Disclosure Bulletin*, vol. 18, No. 2, Jul. 1975.
W. L. Holloway, "Elimination of False Data Caused by Switch Bounce of a Switch-Contact Keyboard", *IBM Technical Disclosure Bulletin*, vol. 27, No. 5, Oct. 1984.

*Primary Examiner*—John W. Caldwell, Sr.
*Assistant Examiner*—Alvin Oberley
*Attorney, Agent, or Firm*—Wilbert Hawk, Jr.; Albert L. Sessler, Jr.

[57] ABSTRACT

A data entry system includes a keyboard which includes a panel of chemically toughened, laminated glass. The upper surface of the panel has a plurality of key areas respectively representative of different keys, and a plurality of LEDs are respectively positioned opposite the key areas adjacent the lower surface of the panel. Each LED has a photodiode associated therewith, each photodiode being arranged to receive infra-red light emitted by the associated LED, transmitted through the glass panel and reflected back from an operator's finger placed on the respective key area to operate that key. Output signals are produced in response to infra-red light reflected back to the photodiodes, and, in response to these signals, a microprocessor produces an output indicative of an operated key. The data entry system is suitable for use in a through-the-wall automated teller machine.

6 Claims, 13 Drawing Figures

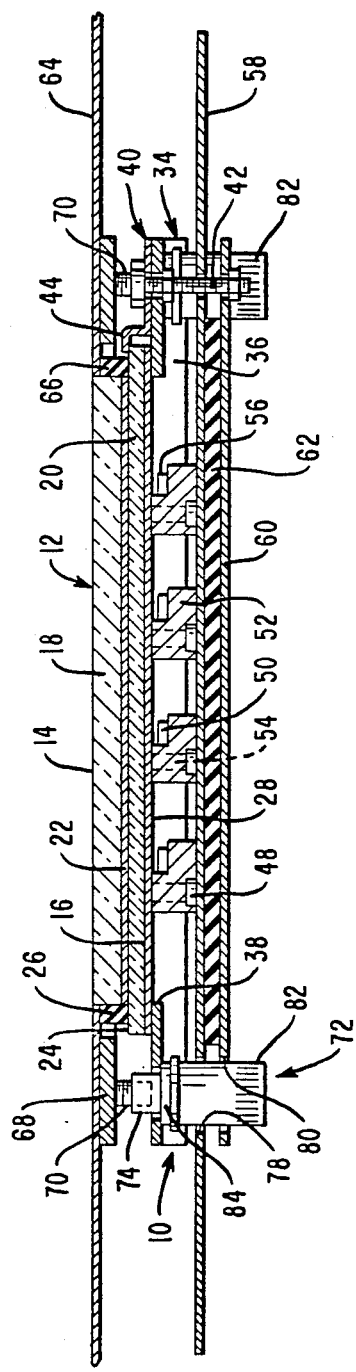
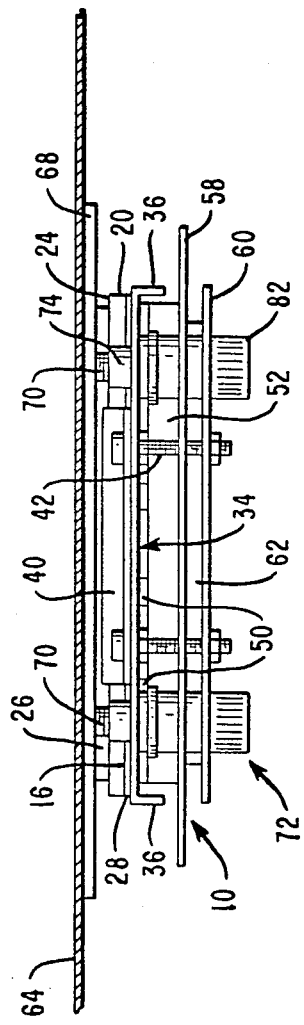
FIG. 2
FIG. 3

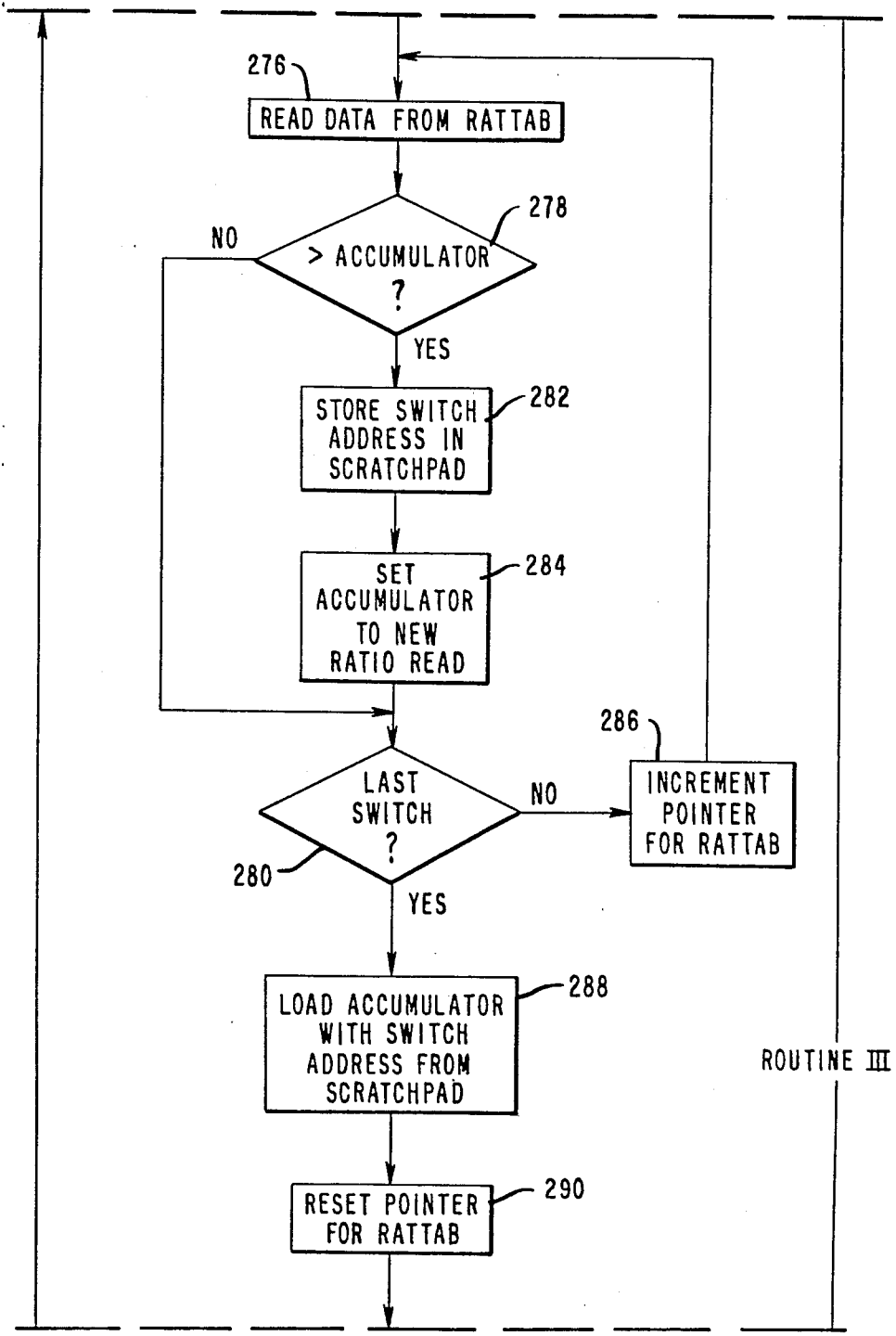

DATA INPUT SYSTEM INCLUDING A KEYBOARD HAVING NO MOVING PARTS

BACKGROUND OF THE INVENTION

This invention relates to a data input system including a keyboard having no moving parts.

The invention has application, for example, to a non-mechanical, vandal resistant keyboard for use with through-the-wall automated teller machines (ATMs). As is well known, in operation of an ATM a user inserts a customer identifying card into the machine and then enters certain data (such as codes, quantity of currency required or to be paid in, type of transaction, etc.) upon a keyboard associated with the machine. The machine will then process the transaction, update the user's account to reflect the current transaction, dispense cash, when requested, and return the card to the user as part of a routine operation. A through-the-wall ATM is mounted in the wall of a bank or other building, with the keyboard being accessible from outside the building.

Keyboards of through-the-wall ATMs are susceptible to vandalism. Thus, keyboards having movable keys used in such ATMs are vulnerable in that vandals may attempt to render the keys inoperative by, for example, applying glue or other viscous material to the keys or by forcing foreign objects into the key mechanism. Moreover, keyboards having movable keys may be adversely affected by environmental conditions such as rain. In many ATMs, the keyboard is protected by an anti-vandal screen which normally covers the keyboard, but which is automatically withdrawn to expose the keyboard when a customer identifying card is inserted into a card receiving slot of the ATM at the commencement of a customer transaction. The problems referred to above are particularly acute in the case of an ATM which is not provided with an antivandal screen.

A non-mechanical, touch keyboard is known, for example, from U.S. Pat. No. 3372789. This known keyboard comprises a transparent plate provided with touch switches consisting of concave cavities in the plate, each cavity being associated with a photoelectric transducer embedded in the plate which is adapted to be energized by a light beam transmitted across said cavity. This light beam is interrupted by a finger of an operator when the operator touches the concave surface of the cavity, thereby producing an electric control impulse which is used to operate a control device. This known touch keyboard has the disadvantage that, when operating in an unprotected outside environment, moisture and debris can accumulate in the cavities and may give rise to operational errors.

There is also known a capacitive touch switching system which enables the proximity of a finger to be detected. For success with this system, it is necessary to maintain complete electrical isolation between switch areas, and such system has the disadvantage that, when operating in an exposed environment, a water film can bridge switch areas and can thereby cause errors in the detection system.

SUMMARY OF THE INVENTION

It is accordingly an object of the invention to provide a data input system including a keyboard which is vandal resistant and which can operate satisfactorily under adverse environmental conditions.

According to the invention, there is provided a data entry system comprising a sheet-like keyboard member of laminated construction of chemically toughened glass having an inner surface and an outer surface, said outer surface having a plurality of key areas respectively representative of different keys; an array of light-emitting devices positioned adjacent said inner surface and arranged to emit light for transmission through said sheet-like member, each light-emitting device being positioned opposite a respective key area, said light-emitting devices being arranged to emit infra-red light, said light-emitting devices being mounted in individual optical support means made of a material which is opaque to infra-red light, and being arranged to emit light in a direction generally perpendicular to said inner and outer surfaces of said sheet-like member; a plurality of light-responsive devices respectively associated with said light-emitting devices, each light-responsive device being arranged to receive light emitted by its associated light-emitting device and reflected from said sheet-like member and from an operator's finger placed in juxtaposition with the respective key area, each light-responsive device being mounted in paired relation in proximity to its corresponding light-emitting device on one of said optical support means, said optical support means being mounted on a printed circuit board which provides electrical connections to said light-emitting devices and said light-responsive devices, also including securing means for holding said printed circuit board in fixed relation with said sheet-like member; means for successively energizing said light-emitting devices in each of a succession of scan cycles; means for successively energizing said light-responsive devices in each scan cycle, each light-responsive device being arranged to be energized prior to the energization of the associated light emitting device; circuit means for producing a succession of output signals in response to the energization of said light-emitting devices, each said output signal being representative of that part of the output of the respective light-responsive device due to light emitted by the associated light-emitting device and reflected back to the light-responsive device, said circuit means including an ambient light subtraction circuit to the input of which the outputs of said light-responsive devices ard arranged to be applied, said light subtraction circuit including capacitor means arranged to acquire a charge during each interval between the energization of a light-responsive device and the energization of the associated light-emitting device, this charge being representative of the output of the respective light-responsive device due to ambient light, and switch means arranged to connect said input to an output portions of said light subtraction circuit via said capacitor means during each period of energization of a light-emitting device, whereby there is applied to said output portion a voltage pulse whose magnitude is dependent on the component of the output of the associated light-responsive device due to light emitted by the respective light-emitting device and reflected back to the associated light-responsive device; and data processing means responsive to said output signals for producing an output indicative of a key operated by an operator's finger being placed in juxtaposition with the respective key area, said data processing means being arranged to store calibration data representative of the said output signal of each light-responsive device in the absence of an operator's finger being placed in proximity with the respective key area, and in which, in operation, said data processing means is arranged to generate in each scan cycle data ratios each representative of the value of said output signal of a respective light-responsive device to the respective calibration data for that device, said data processing means being arranged to produce an output indicative of an operated key on the basis of an evaluation of said data ratios.

BRIEF DESCRIPTION OF THE DRAWINGS

One embodiment of the invention will now be described by way of example with reference to the accompanying drawings, in which:

FIG. 2 is a side elevation view of the keyboard shown secured to the fascia of an ATM, the section being taken along the line 2—2 of FIG. 1;

FIG. 3 is an end elevation of the keyboard shown secured to the fascia;

FIGS. 6A to 6H taken together form a detailed flow diagram explaining the operation of the data input system.

DETAILED DESCRIPTION OF THE PREFERRED EMBODIMENT

Figure 1:
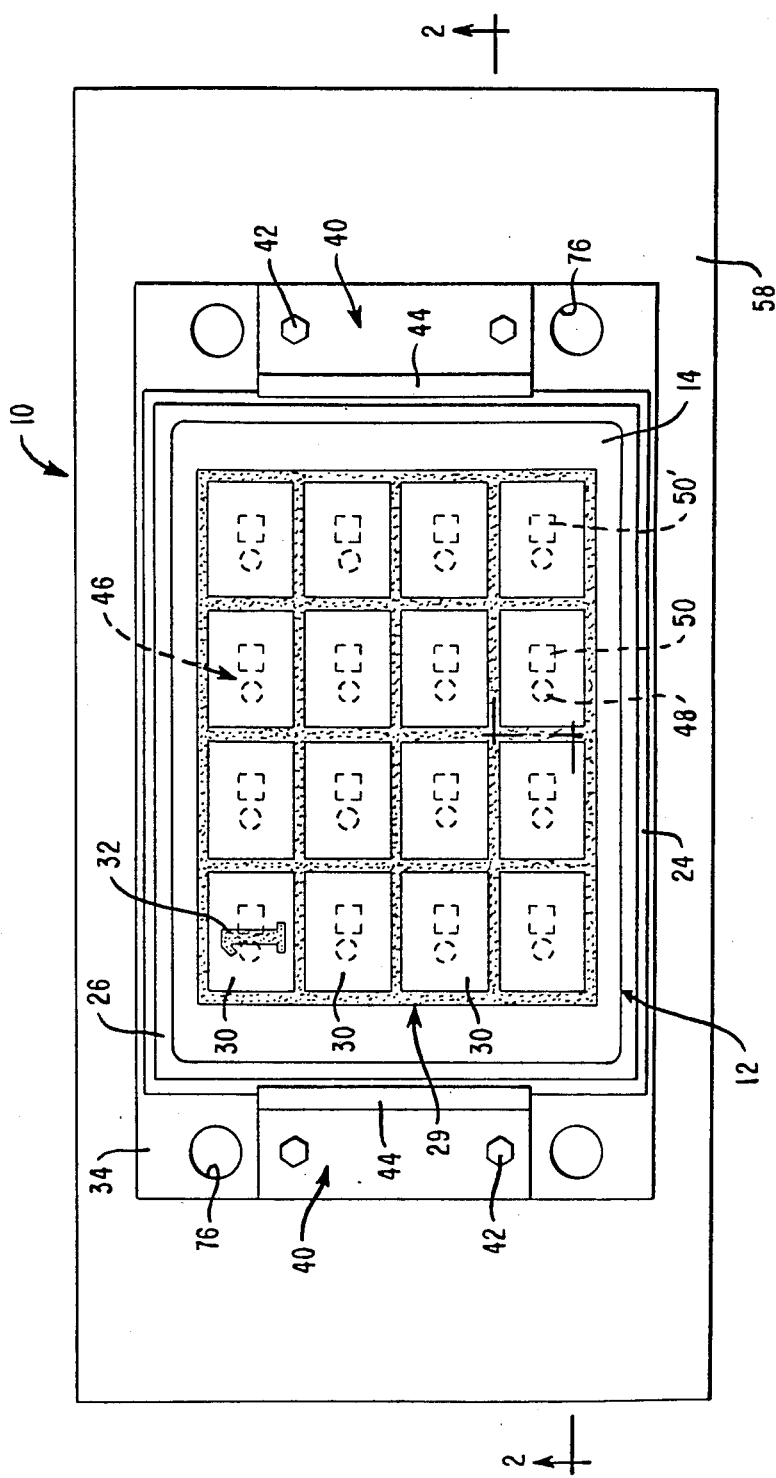
FIG. 1 is a plan view of a keyboard of a data input system in accordance with the present invention.

Referring to FIGS. 1 to 3 of the drawings, the keyboard 10 of the data input system includes a panel 12 of laminated, chemically toughened glass having a planar outer or upper surface 14 and a planar inner or lower surface 16, the perimeter of the surface 14 being rounded in order to alleviate the risk of damage thereto. The panel 12 comprises an upper glass sheet 18 and a lower glass sheet 20 which are secured together by means of an adhesive layer 22 of transparent resin, the overall thickness of the panel 12 being about 1 centimeter. The lower sheet 20 is of larger area than the upper sheet 18 so as to provide a shoulder 24 extending around the sheet 18. A rubber seal 26 fits tightly around the sheet 18 and abuts against the shoulder 24.

A graphics sheet 28 is secured to the lower surface 16 of the panel 12. The sheet 28 is of plastic material and carries on its upper surface a pattern 29 in a dye based ink which is visible through the panel 12, the pattern 29 delineating sixteen key areas 30 on the surface 14 of the panel 12 and portraying the respective key indentifying indicia 32 (only one of which is shown in FIG. 1) located inside the areas 30. The key areas 30 are arranged in rows and columns as shown in FIG. 1 and respectively represent a plurality of different keys. On the lower surface of the graphics sheet 28 there is provided a white coating which is reflective to visible light and which enhances the visibility of the pattern 29 from an operating position above the keyboard 10. The graphics sheet 28, including the white reflective coating and the pattern 29, is transparent to infrared light.

The assembly of the panel 12 and the graphics sheet 28 is mounted on a metal support 34 which has downwardly extending side walls 36 and which is provided with a central aperture 38 substantially coextensive with the glass sheet 18. This assembly is secured to the support 34 by means of two metal retainer members 40 which are positioned adjacent opposite sides of the panel 12 and which are bolted to the support 34 by means of bolts 42. The retainer members 40 are respectively provided with two lips 44 which extend partly over the shoulder 24 of the panel 12 and thereby hold the panel 12 firmly in position on the support 34.

The key areas 30 of the keyboard 10 are respectively associated with switch devices 46 positioned under the panel 12, each switch device being positioned immediately below the respective key area 30. Each switch device 46 includes a light-emitting diode (LED) 48 and a photodiode 50 positioned closely adjacent thereto. A suitable LED is model SFH 400-3, supplied by Siemens AG, Munich, West Germany, and a suitable photodiode is model BPW 41, supplied by AEG Telefunken Electronic, Heilbronn, West Germany. For reasons which will be explained later, each LED 48 emits a narrow beam of infra-red light (having an angle of divergence of 6 degrees), and each photodiode 50 has a wide reception angle. The switch devices 46 (hereinafter simply referred to as switches 46) are arranged in four columns corresponding to the columns of key areas 30. Referring particularly to FIG. 2, the LEDs of each column are mounted in a respective elongated optical support member 52 made of an electrically insulating plastic material which is opaque to infra-red light; a suitable material for this purpose is carbon grey ABS (acrylonitride butadiene styrene). Each LED 48 is mounted in a cylindrical aperture 54 extending through the relevant support member 52, the arrangement being such that in operation the LED emits infra-red light in a direction generally perpendicular to the main surfaces of the panel 12. The photodiodes 50 of each column of switches 46 are mounted on a shoulder 56 of the relevant support member 52, each photodiode 50 being positioned adjacent the light-emitting end of the associated LED 48. The optical support members 52 are secured to a printed circuit board 58 which provides electrical connections to the LEDs 48 and photodiodes 50.

The assembly of the printed circuit board 58 and the optical support members 52 is held in position by means of a rigid metal backing plate 60 and a resilient rubber layer 62 interposed between the printed circuit board 58 and the plate 60, the plate 60 being bolted to the metal support 34 by means of the bolts 42. With the assembly of the printed circuit board 58 and optical support members 52 mounted in position, the resilient layer 62 is compressed to a certain extent so as to urge the optical support members 52 into contact with the graphics layer 28. By virtue of this mounting arrangement, the photodiodes 50 and the light-emitting ends of the LEDs 48 are positioned closely adjacent the graphics sheet 28, with the LED 48 and photodiode 50 of each switch 46 being located immediately below the respective key area 30.

The keyboard 10 is secured to the fascia 64 (not shown in FIG. 1) of the ATM (not otherwise shown), the upper sheet 18 of the panel 12 accurately fitting in an aperture 66 formed in the fascia 64 with the surface 14 of the panel 12 being coplanar with the outer surface of the fascia 64. An apertured mounting plate 68, which surrounds the rubber seal 26, is secured to the underside of the fascia 64. The mounting plate 68 is provided with two pairs of downwardly extending threaded locating studs 70, the two pairs of studs 70 being positioned on opposite sides of the panel 12. Four thumbscrews 72 are used to secure the keyboard 10 to the mounting place 60. Each thumbscrew 72 has an internally threaded, cylindrical end portion 74 which operatively engages with a respective one of the threaded studs 70, the end portion 74 passing through a respective aperture 76 formed in the metal support 34. The thumbscrews 72 pass through respective apertures 78 formed in the printed circuit board 58 and through respective apertures 80 formed in the backing plate 60. Knurled head portions 82 of the thumbscrews 72 project beneath the backing plate 60. As the thumbscrews 72 are tightened, a shoulder 84 formed at the base of the end portion 74 of each thumbscrew 72 engages with the underside of the metal support 34, and continued tightening of the thumbscrews 72 brings about a compression of the rubber seal 26 between the underside of the fascia 64 and the shoulder 24 of the panel 12. A firm and secure attachment of the keyboard 10 to the fascia 64 is thereby achieved, with the seal 26 preventing the ingress of any dust or moisture into the interior of the keyboard 10.

Figure 4:
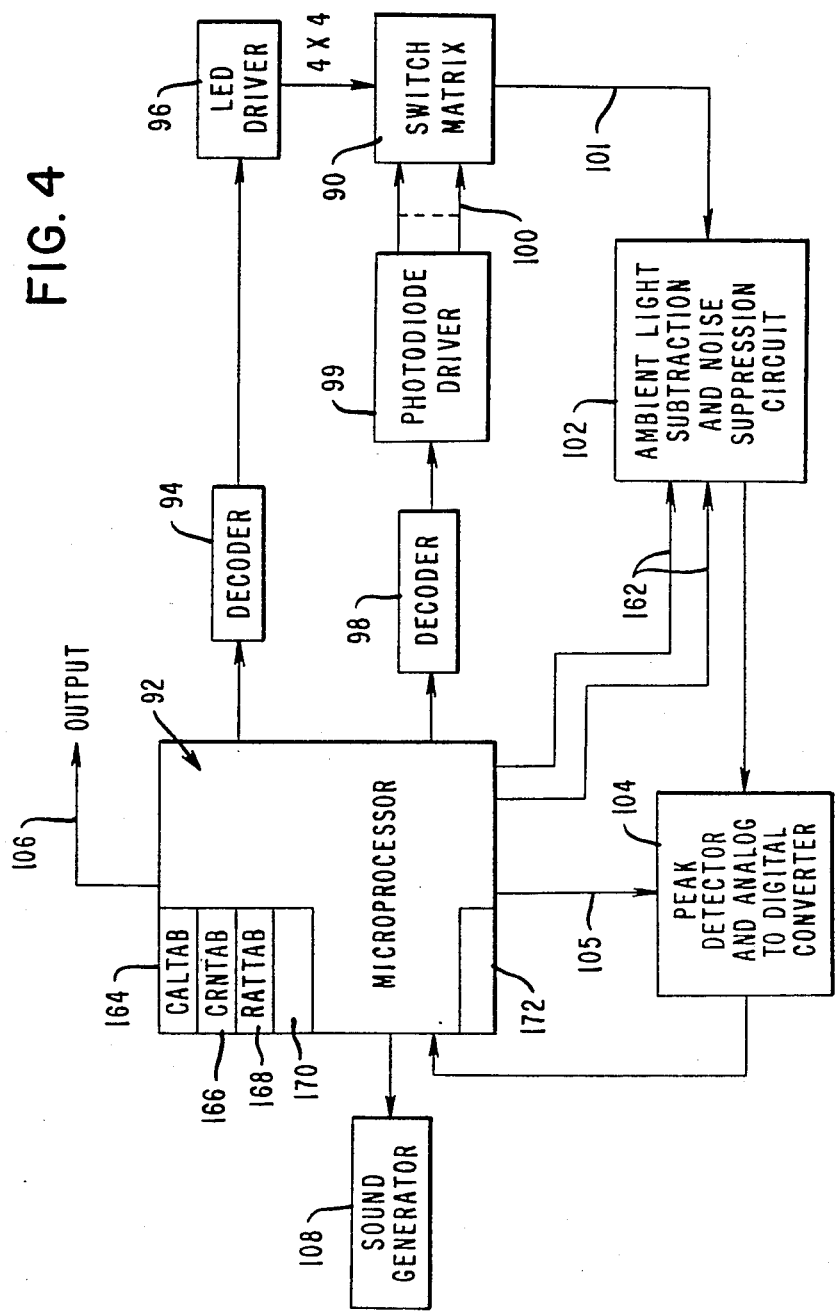
FIG. 4 is a block diagram of a control and data processing circuit of the data input system.

Referring now to FIG. 4, the LEDs 48 and photodiodes 50 constituting the switch matrix 90 are energized and de-energized in a succession of scan cycles, the energization and de-energization of the devices being controlled by a microprocessor 92, such as a Motorola microprocessor model 6801. The LED control outputs of the microprocessor 92 are connected to a decoder 94, the outputs of which are applied to an LED driver circuit 96. The driver circuit 96 provides a 4×4 output for successively energizing the LEDs 48 of the switch matrix 90, the "on" time of each LED being 20 microseconds and the scan time of the matrix being 24.5 milliseconds. With reference to FIG. 1, during a scan cycle the LEDs 48 are energized in succession from left to right, row by row, commencing with the leftmost LED 48 of the top row and ending with the rightmost LED 48 of the bottom row. Following the completion of one scan cycle, the next scan cycle commences immediately. The photodiode control outputs of the microprocessor 92 are connected to a decoder 98 which has 16 outputs. These outputs are applied to a photodiode driver circuit 99 which has 16 output lines 100 over which signals are applied to the photodiodes 50 of the switch matrix 90 for successively energizing the photodiodes 50, each photodiode 50 being de-energized simultaneously with the energization of the next photodiode 50. Each photodiode 50 is arranged to be energized 0.2 millisecond prior to the energization of the associated LED 48. Apart from the bottom righthand photodiode 50' (which is the last photodiode to be energized in a scan cycle), each photodiode 50 has an "on" time of 1.5 milliseconds. The photodiode 50' has an extra long "on" time of 2 milliseconds to give the microprocessor 92 time to carry out various software routines prior to the commencement of the next scan cycle.

The outputs of the photodiodes 50 of the matrix 90 are connected over a common output line 101 to an ambient light subtraction and noise suppression circuit 102. As will be explained in more detail later, the circuit 102 serves to remove from the output of each photodiode 50 components due to ambient light and noise. Thus, the circuit produces a series of output pulses in response to the output pulses from the photodiodes 50, each output pulse from the circuit 102 being representative of that part of the respective photodiode output which is due to light emitted from the associated LED 48 and reflected back to the photodiode 50 (said part being hereinafter referred to as the LED component).

Operation of the keyboard 10 is brought about by an operator placing a finger in juxtaposition with a selected key area 30 of the panel 12, that is, say, by touching the key area 30 with the finger or by placing the finger in close proximity thereto. In the absence of an operator's finger being placed on a key area 30, the respective photodiode 50 receives some infra-red light from the associated LED 48 which has been reflected back from the panel 12, mainly from the upper surface 14. When an operator's finger is placed on a particular key area 30, the output of the respective photodiode 50 increases very considerably due to infra-red light reflected from the finger. As will be explained later, when the ratio of the peak amplitude of the LED component of a particular photodiode to the corresponding peak amplitude when no operator's finger is present on the respective key area 30 exceeds a predetermined minimum ratio (typically chosen to be 3 to 1), then, provided certain other criteria are met, this indicates that the respective key has been operated by having a finger placed on the respective key area 30. In practice, it is found that when an operator's finger is placed on a key area 30, the above-mentioned ratio for the respective switch 46 has a value of around 10 to 1. It should be understood that, by virtue of the fact that each LED 48 emits a narrow beam of infra-red light, scattering of the infra-red light by the panel 12 is reduced so that the voltage output of each photodiode 50 due to light reflected from the panel 12 is kept to an acceptably low level.

The output of the circuit 102 is applied to a conventional peak detector and analog to digital converter circuit 104 which converts each output pulse from the circuit 102 into an 8 bit digital signal representative of the peak amplitude of the LED component of the respective photodiode output. The output signals of the circuit 104 are applied to the microprocessor 92. Reset signals are applied to the circuit 104 from the microprocessor 92 over a line 105 so as to reset this circuit following the generation of each digital output signal by the circuit 104.

Prior to the keyboard 10 becoming operational, an 8 bit calibration value is separately stored in the microprocessor 92 for each switch 46. This calibration value is the average of 256 output signals from the circuit 104 for the respective photodiode 50 in the absence of an operator's finger in juxtaposition with the respective key area 30. In practice, due to variations in the gains of the switches 46, the calibration value may vary from one photodiode 50 to another. In a manner to be explained, the microprocessor 92 generates in respect of each incoming digital signal from the circuit 104 a data ratio representative of the ratio of the value of the incoming signal to the respective stored calibration value, and on the basis of these data ratios the microprocessor 92 makes a determination as to whether a key has been operated by having a finger placed in juxtaposition with the relevant key area 30. Upon the microprocessor 92 determining that a key has been operated, a signal to that effect is sent by the microprocessor 92 to a host computer (not shown) via an output line 106, and a signal is sent by the microprocessor 92 to a sound generator 108 to provide an audible response which indicates to the operator that a key operation has been effected. Typically, the duration of a key operation is represented by 10 to 15 scan cycles of the switch matrix 90.

Figure 5:
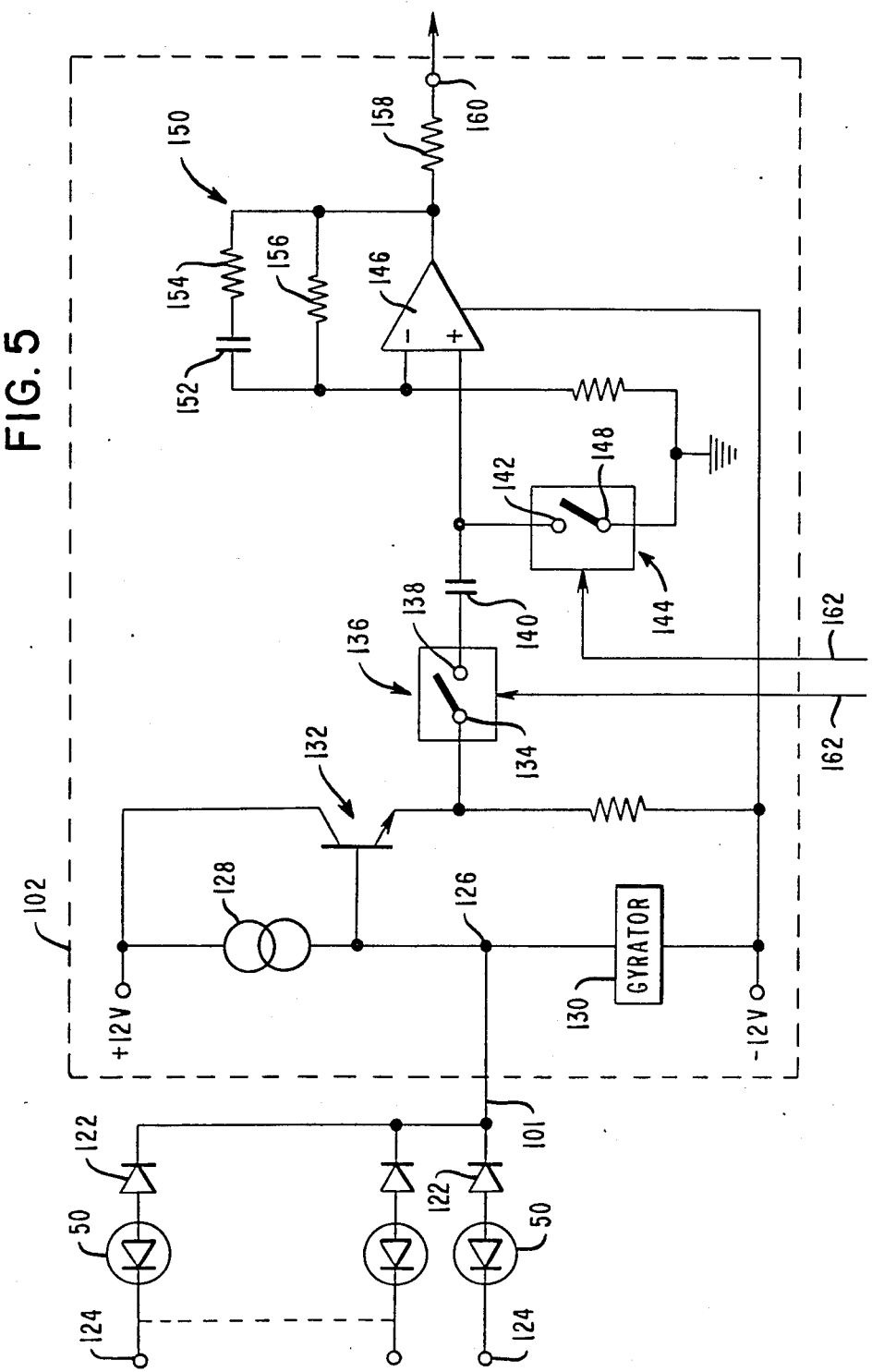
FIG. 5 is a circuit diagram of a switch matrix and an ambient light and noise suppression circuit included, in the circuit shown in FIG. 4.
Figure 6A:
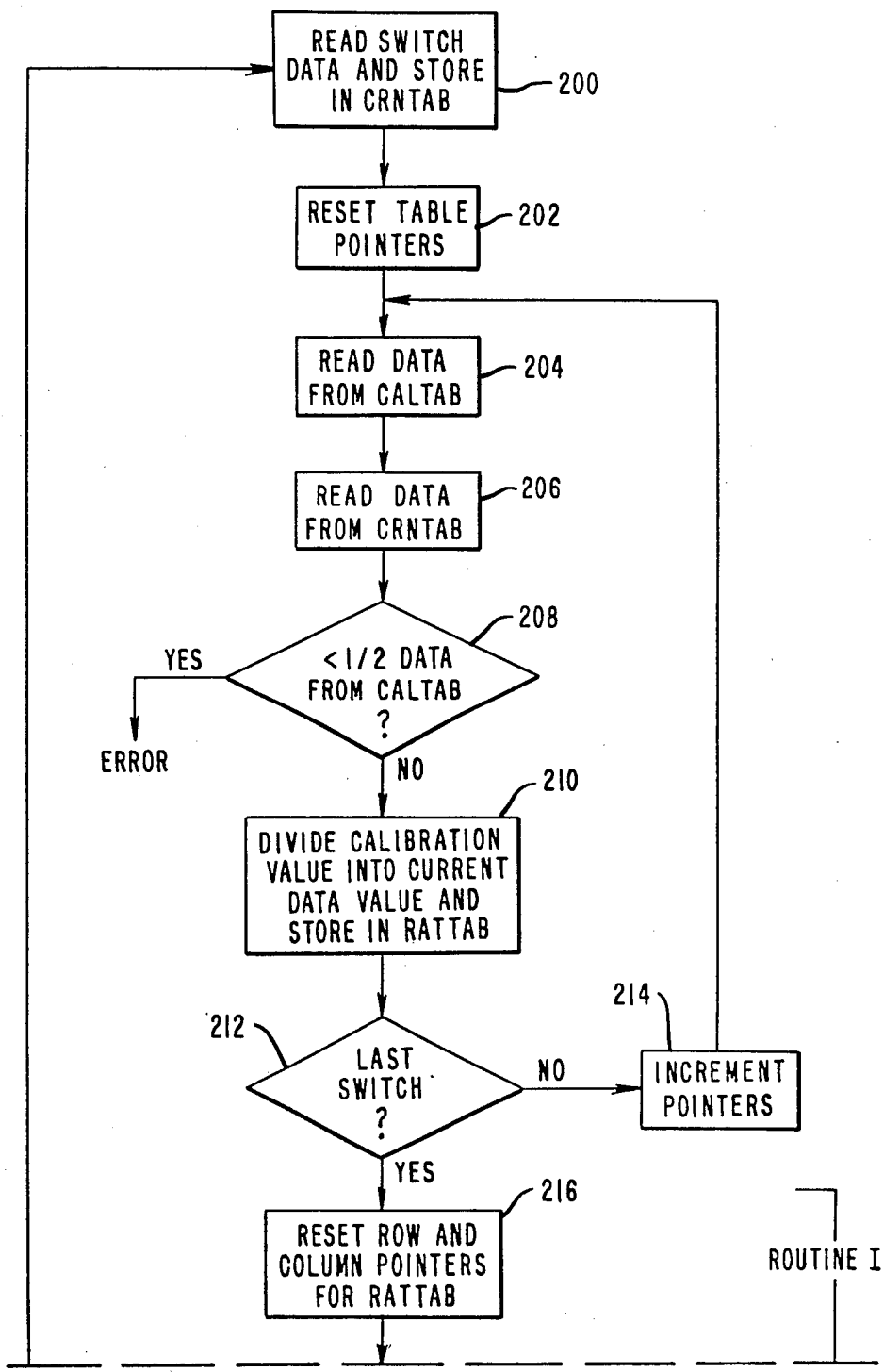
Figure 6B:
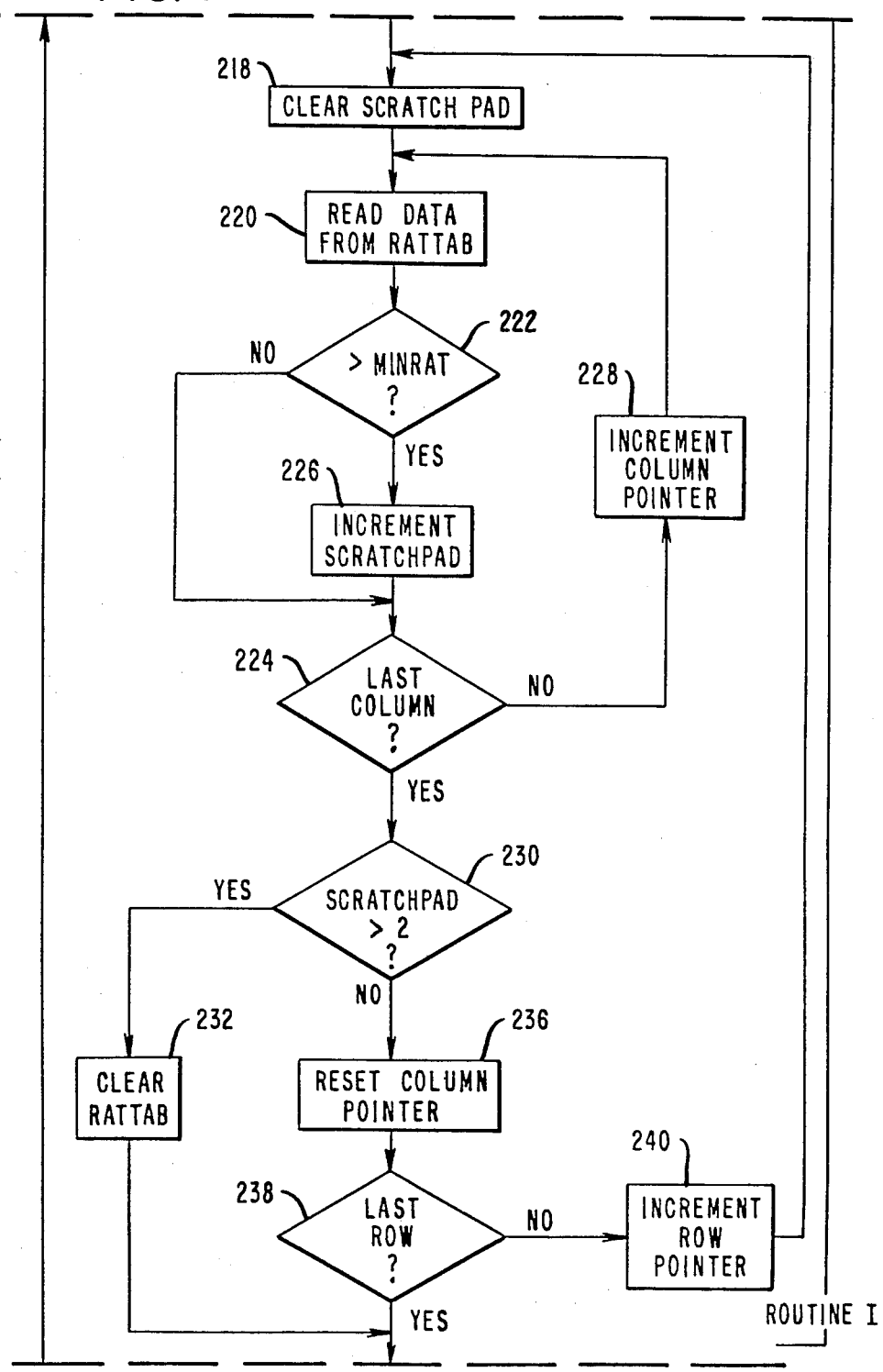
Figure 6C:
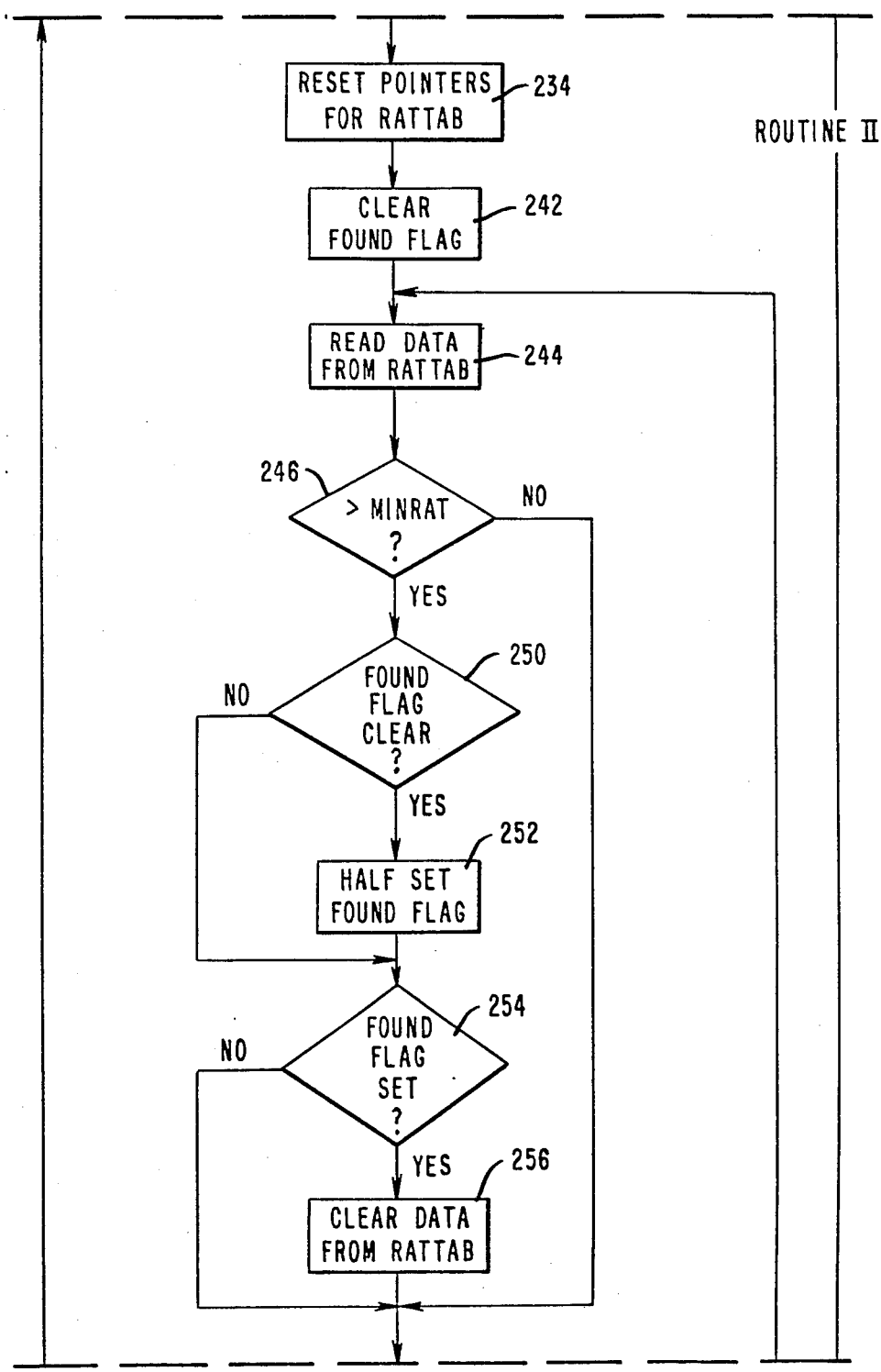
Figure 6D:
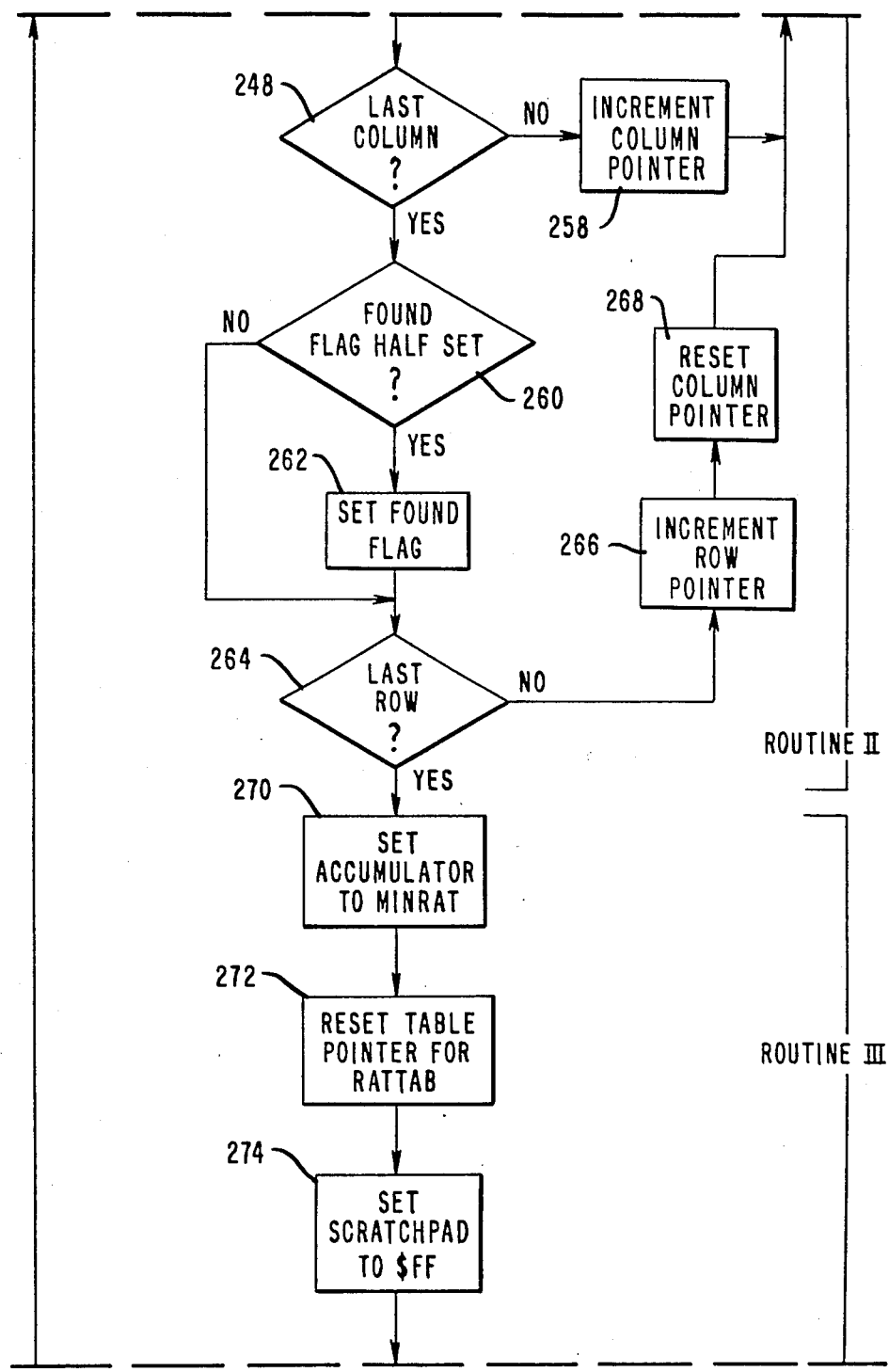
Figure 6F:
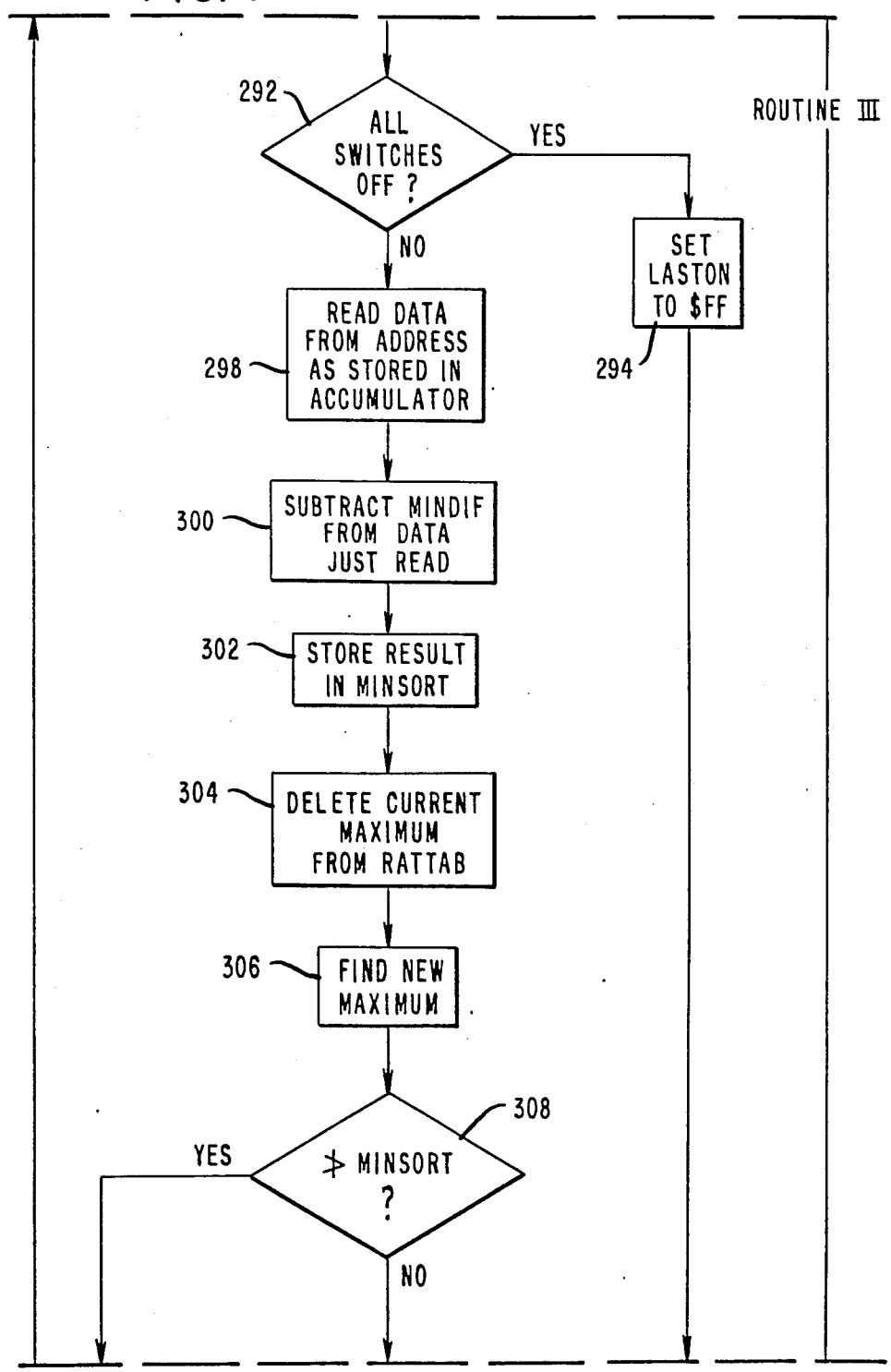
Figure 6G:
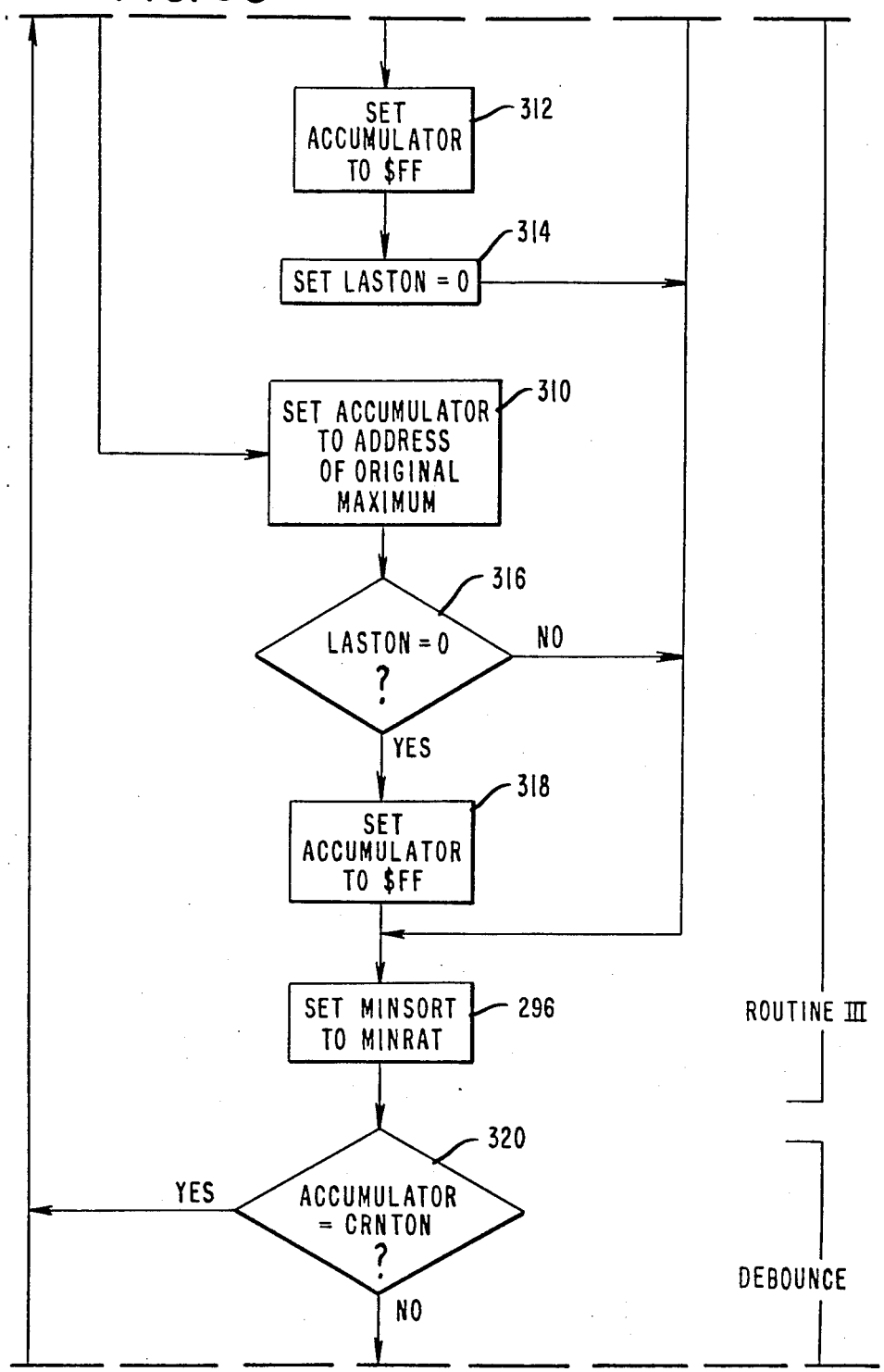
Figure 6H:
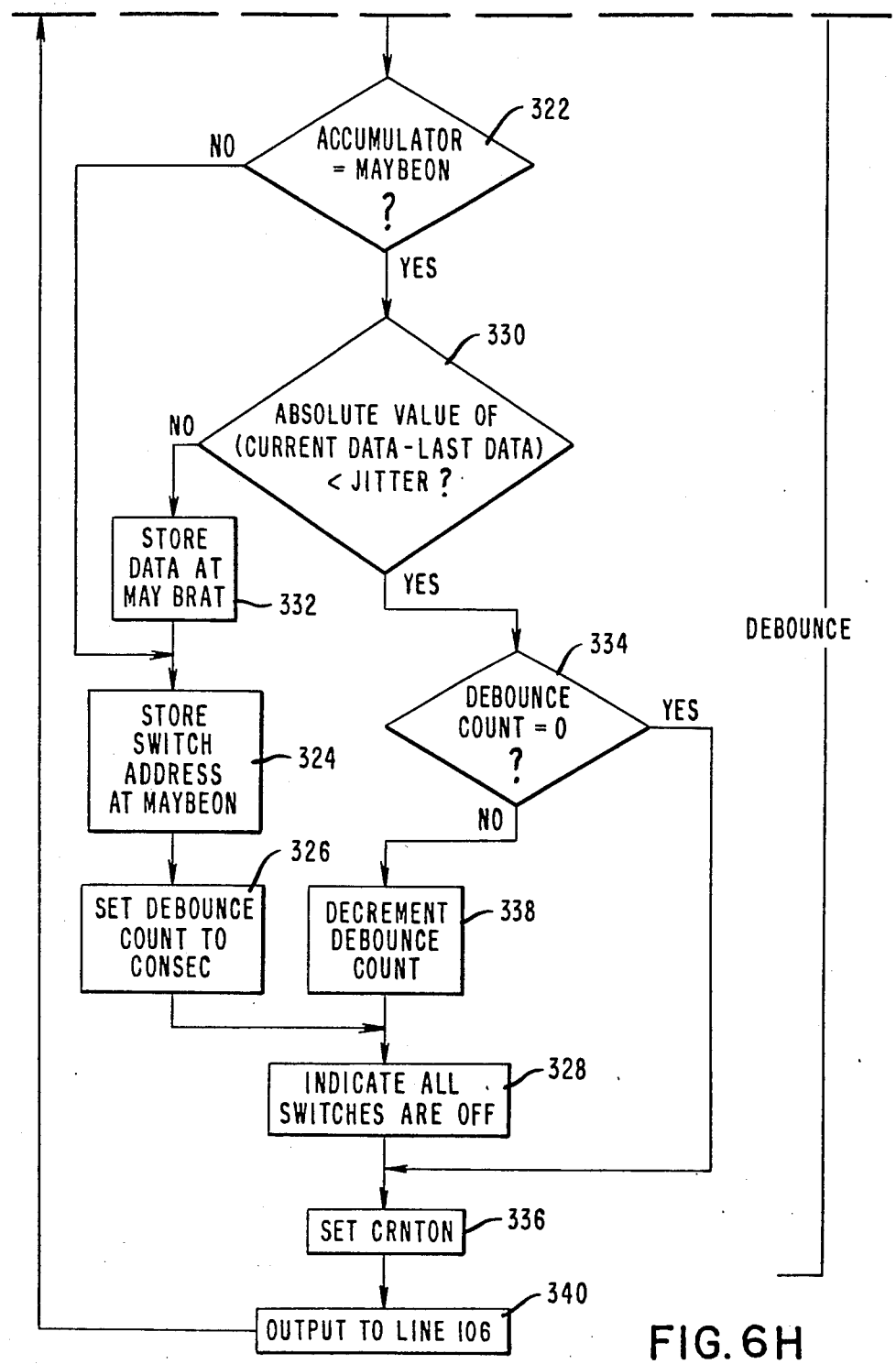

Referring in particular to FIG. 5, the output terminal of each of the photodiodes 50 is connected via a respective diode 122 to the common output line 101 (see also FIG. 4), the input terminal 124 of each photodiode 50 being connected to the respective output 100 of the photodiode driver circuit 99 (FIG. 4). The line 101 is connected to a point 126 which constitutes the input to the ambient light subtraction and noise suppression circuit 102. The point 126 is connected to a +12 volts voltage supply via a constant current source 128, and to a −12 volts voltage supply via an electronic inductor (also known as a gyrator) 130. The point 126 is also connected via a transistor buffer circuit 132 to a first terminal 134 of an electronic switch 136. A second terminal 138 of the switch 136 is connected via a capacitor 140 to a first terminal 142 of a second electronic switch 144 and to the positive input of an operational amplifier 146. A second terminal 148 of the switch 144 is connected to ground, as is the negative input of the amplifier 146. A filter circuit 150 is connected between the output and negative input of the amplifier 146, the filter circuit 150 consisting of the series combination of a capacitor 152 and a resistor 154 connected in parallel with a further resistor 156. The output of the operational amplifier 146 is connected via a resistor 158 to a terminal 160 which is connected to the input of the peak detector and analog to digital converter circuit 104 (FIG. 4). The switching on and off of the electronic switches 136 and 144 is controlled by signals from the microprocessor 92 applied to the switches 136 and 144 over lines 162.

The operation of the circuit 102 will now be described. At the time a photodiode 50 is switched on (by the application of a +12 volts diode select pulse applied to the respective input terminal 124), the switch 144 is closed and the switch 136 is open. After a short interval of time and prior to the associated LED 48 being energized, the switch 136 is closed, whereupon the capacitor 140 charges, the charge acquired by the capacitor 140 being representative of the output of the relevant photodiode 50 due to ambient light. In this connection, it should be understood that at the time the switch 136 is closed a voltage has been developed across the gyrator 130 due to the change in current therethrough brought about by the switching on of the relevant photodiode 50, the magnitude of this change being dependent upon the intensity of the ambient light falling upon the said photodiode 50. After a further short interval of time, sufficient for the voltage on the capacitor 140 to stabilize, the switch 136 is opened so as to isolate the capacitor 140 from the array of switches 46. The LED 48 associated with the activated photodiode 50 is then switched on, and after a short period of time sufficient for switching surges to die away the switch 136 is closed and the switch 144 is opened. Thereupon a voltage pulse is applied to the positive terminal of the operational amplifier 146, the magnitude of this pulse being dependent on the LED component of the output of the activated photodiode 50. It should be understood that the filter circuit 150 serves to suppress high frequency noise. Also, the circuit 102 suppresses noise due to mains frequency modulated light emitted by any filament lamp or flourescent lamp in the vicinity of the keyboard 10.

The operation of the data input system will now be described. Firstly, it will be assumed that calibration values for all the switches 46 have been stored in the microprocessor 92 as previously described, these values being stored as a calibration table (CALTAB) in a memory region 164 (FIG. 4) in the microprocessor 92. During a scan cycle in the course of a key operation, the switches 46 are energized and the 8 bit digital values (hereinafter referred to as the current data values) representative of the peak values of the LED components of the outputs of the photodiodes 50 are stored as a current data table (CRNTAB) in a memory region 166 in the microprocessor 92. As a check on the validity of the data read from the switches 46, the current data value for each switch 46 is compared in the microprocessor 92 with the respective calibration value. If a current data value is less than half the respective calibration value, then it is assumed that a fault has developed and an error signal is generated.

Assuming that a fault has not developed, the microprocessor 92 causes the calibration values to be divided into the respective current data values, the ratios thus obtained being stored as a data ratio table (RATTAB) in a memory region 168 in the microprocessor 92. It should be understood that this routine compensates for any variations in the gains of the switches 46 by converting the current data values into ratios.

The microprocessor then carries out a test (ROUTINE I) to ascertain if data ratios each having a value greater than the predetermined minimum ratio previously referred to have been derived from switches 46 in more than two columns of a row of the switch matrix 90. If such situation is found to exist, then all the read switch data is considered to be invalid. The reason for this routine is that it is assumed that a switch is operated with a single finger. On the basis of this assumption, it is reasonable to expect that data ratios greater than the predetermined minimum ration (MINRAT) will be derived from not more than two adjacent columns of the switch matrix 90. If data ratios greater than said minimum are derived from more than two adjacent columns, then it is likely that the operator is resting a hand on the panel 12 or has not yet decided on what data to enter; in both these cases the read data is indeterminate and is discarded.

Next, a further software routine (ROUTINE II) is carried out in which the data in the data ratio table RATTAB is caused to be scanned row by row commencing with the highest row (corresponding to the highest row of key areas 30 as viewed in FIG. 1) and working down towards the lowest row (corresponding to the lowest row of key areas 30 as viewed in FIG. 1). Once a data ratio greater than MINRAT has been found, data ratios from any lower row of the data ratio table are disregarded. The reason for this routine is that it is assumed that a key of the keyboard 10 will be operated with an outstretched finger, so that a data ratio derived from a key position 30 which is relatively high in its respective column (as viewed in FIG. 1) will be of greater significance that a data ratio derived from a key position 30 lower down in that column.

The microprocessor 92 then proceeds to a further routine (ROUTINE III). This routine selects the highest ratio from the data ratio table RATTAB and also checks if this ratio is greater than the predetermined minimum ratio MINRAT. If it is not, then all the switches 46 are considered to be inoperative, that is to say in a non-operated condition. If it is, then a check is made on the next highest ratio in the table RATTAB. If the next highest ratio is too close to the highest ratio then all the switches 46 are considered to be inoperative as no clear choice can be made among the switches 46. If the highest data ratio is greater than MINRAT and the next highest ratio is not too close, then that switch 46 in respect of which the highest data ratio is guaranteed is considered to be the operated switch or key, subject to the selection of this switch or key being confirmed by the following routine.

The routine just described is followed by a routine (hereinafter referred to as the DEBOUNCE routine) which is intended to establish if an operator's finger is in a stationary position in juxtaposition with a key area 30 (which will normally mean that a finger has been placed in actual contact with the key area 30). In this routine a check is first made to ascertain if the highest data ratio has been derived from the same switch 46 in two successive scan cycles. If it has not, all the switches 46 are considered to be inoperative. If it has, then the routine goes on to examine the current data value (as opposed to data ratio) for the switch 46 thus selected. If the difference between successive values of the current data in respect of this switch is within predetermined limits for a predetermined number of sequential scan cycles then the microprocessor 92 proceeds to the output routine; otherwise, all the switches 46 are considered to be inoperative.

In the output routine, if the selection of a switch or key has been confirmed by the DEBOUNCE routine, then an output signal is generated by the microprocessor 92 on the line 106 indicative of the selected key. At the same time, an audible response is produced by the sound generator 108 to indicate to the operator that a key operation has been effected.

The software routine referred to above will now be described in more detail with reference to the flow diagram shown in FIGS. 6A to 6H.

During a scan cycle of the keyboard 10, in an initial step represented by block 200, switch data represented by the current data values of the outputs of the photodiodes 50 is stored as the current data table CRNTAB as previously described. As previously mentioned, the photodiode 50' has a relatively long "on" time. It should be understood that various software routines to be described hereinafter take place during that part of the "on" time of the photodiode 50' subsequent to the de-energization of the respective LED 48.

In the step represented by block 202 the table pointers of the tables CALTAB, CRNTAB and RATTAB are reset. Next, the calibration value contained in the first location of the table CALTAB is read (block 204) and the current data value contained in the first location of the table CRNTAB is read (block 206), each of these locations corresponding to the first switch 46 to be energized in the scan cycle. These values are then compared (block 208) to ascertain if the current data value is less than half the calibration value. If it is, then an error signal is sent to the host computer over line 106 (FIG. 4) and the keyboard 10 is rendered non-operational; if it is not, then the routine proceeds to the next step (block 210). In this next step, the calibration value is divided into the current data value and the result is stored in the memory region 168 as the first ratio of the table RATTAB. A determination is then made (block 212) as to whether the calibration and current data values corresponding to the last switch 46 to be energized in the scan cycle have been read. If they have not, the pointers for the various tables are incremented by one (block 214) and the steps represented by blocks 204 and 212 are repeated.

If in the step represented by block 212 a determination is made that the calibration and current data values corresponding to the last switch 46 have been read, the microprocessor 92 proceeds to the step represented by block 216, which is the first step of ROUTINE I previously referred to. In this last-mentioned step (block 216) row and column pointers for the table RATTAB are reset, and then a scratchpad represented by a dedicated memory region 170 of the microprocessor 92 is cleared (block 218), that is to say set to zero. Next, the data stored in the first location (first row, first column) of the table RATTAB is read (block 220) and this is checked (block 222) to ascertain if it is greater than the predetermined minimum ratio MINRAT. If it is not, the routine proceeds directly to the step represented by block 224, and if it is, the scratchpad 170 is incremented by one (block 226) before the routine proceeds to this last-mentioned stop. In the step represented by block 224 a check is made as to whether the data just read from the table RATTAB is located in the last column of this table, and, if it is not, the column pointer for this table is incremented by one (block 228) and the routine returns to the step represented by block 220. After the data in the location represented by the last column of the first row of the table RATTAB has been read, a check is made (block 230) to ascertain if the scratchpad contains a value greater than two. If it does, this means that data ratios each having a value greater than MINRAT have been derived from switches 46 in more than two columns of a row of the switch matrix 90, which is an invalid condition. Accordingly, in this case the table RATTAB is cleared (block 232) and the microprocessor 92 proceeds to the first step (block 234) of the next routine (ROUTINE II), which in effect (since the table RATTAB is cleared) means that the microprocessor 92 returns to the initial step represented by block 200. If it is found (block 230) that the scratchpad 170 does not contain a value greater than two, then the column pointer for the table RATTAB is reset (block 236), and a check is made (block 238) as to whether the data just read from the table RATTAB is located in the last row of this table. If it is not, the row pointer for the table RATTAB is incremented by one (block 240) and the routine returns to the step represented by block 218; if it is, the routine proceeds to the step represented by block 234.

In the step represented by block 234, the row and column pointers for the table RATTAB are reset. Next, a memory location (hereinafter referred to as FOUND FLAG) in the microprocessor 92 is cleared (block 242). At this stage it should be mentioned that the location FOUND FLAG has three possible conditions, namely clear, half set or set. After the FOUND FLAG has been cleared, the data stored in the first location (first row, first column) of the table RATTAB is read (block 244) and this is checked (block 246) to ascertain if it is greater than MINRAT. If it is not, the routine proceeds directly to the step represented by block 248, and, if it is, the routine proceeds to the step represented by block 250 in which a check is made as to whether the FOUND FLAG is clear. If the FOUND FLAG is clear, then the FOUND FLAG is half set (block 252) and the routine proceeds to the step represented by block 254; if the FOUND FLAG is not found to be clear (block 250) then the routine proceeds directly to the step represented by block 254. In this last mentioned step a check is made to ascertain if the FOUND FLAG is set. If it is, the location in the table RATTAB which has just been read is cleared (block 256) and the routine proceeds to the step represented by block 248; if the FOUND FLAG is not found to be set (block 254) then the routine proceeds directly to the step represented by block 248. In the step represented by block 248, a check is made as to whether the data just read from the table RATTAB is located in the last column of this table, and, if it is not, the column pointer for this table is incremented by one (block 258) and the routine returns to the step represented by block 244. After the data in the location represented by the last column of the first row of the table RATTAB has been read, a check is made (block 260) to ascertain if the FOUND FLAG is half set. If it is, the FOUND FLAG is then set (block 262) and the routine proceeds to the step represented by block 264; if it is not, the routine proceeds directly to this last-mentioned step. In the step represented by block 264 a check is made as to whether the data just read from the table RATTAB is located in the last row of this table, and, if it is not, the row pointer for this table is incremented by one (block 266) and the column pointer is reset (block 268), and the routine returns to the step represented by block 244. After the data in the location represented by the last column of the last row of the table RATTAB has been read, the microprocessor 92 proceeds to the first step (block 270) of the next routine (ROUTINE III). It will be appreciated that the ROUTINE II just described serves to locate the first row in the table RATTAB in which a ratio greater than MINRAT is stored and then clear all subsequent rows of this table of ratios greater than MINRAT.

In the step represented by block 270, an accumulator 172 (FIG. 4) included in the microprocessor 92 is set to store the predetermined minimum ratio MINRAT. Next, the table pointer for the table RATTAB is reset (block 272) and the scratchpad 170 is set to store $FF (block 274), indicative that all the switches 46 are in an inoperative condition. The ratio contained in the first location in the table RATTAB is then read (block 276) and this is checked (block 278) to ascertain if it is greater than the ratio MINRAT stored in the accumulator 172. If it is not greater, the routine proceeds directly to the step represented by block 280. If it is greater, the address of the associated switch 46 is stored in the scratchpad 170 (block 282) and the accumulator 172 is set to store the ratio just read (block 284). In the step represented by block 280 a check is made as to whether the data just read from the table RATTAB is located in the last location of this table, and, if it is not, the pointer for this table is incremented (block 286) and the routine returns to the step represented by block 276. When the data in the last location of the table RATTAB has been read, the switch address from the scratchpad 170 (which is the address of the RATTAB Location in which the greatest ratio is stored) is loaded into the accumulator 172 (block 288) and the pointer for the table RATTAB is reset (block 290). Next, a check is made (block 292) as to whether all the switches 46 are inoperative (that is to say none of the locations in the table RATTAB stored a ratio greater than MINRAT), and if the answer is "YES" then a memory location (herein referred to as LASTON) in the microprocessor 92 is set to store $FF (block 294) and the routine proceeds to the step represented by block 296, which is the final step in ROUTINE III. On the other hand, if not all the switches 46 are found to be inoperative, there is then read (block 298) the ratio stored in the RATTAB location whose address is stored in the accumulator 172 and from this ratio there is subtracted (block 300) a predetermined value MINDIF (which may typically have a value equal to 2), the result being stored (block 302) in a memory location (hereinafter referred to as MINSORT) in the microprocessor 92. The current maximum ratio is deleted from the table RATTAB (block 304), and a sort routine is called to find the new maximum in the table RATTAB (block 306). A check is made (block 308) to ascertain if this new maximum fulfills the requirement that it is not greater than the contents of the location MINSORT, i.e. that it is less than the original maximum ratio by at least the value MINDIF; in other words, a check is made that the new maximum ratio is not too close to the original maximum ratio for a clear choice to be made. If it is found that this requirement is fulfilled, then the routine proceeds to the step represented by block 310 in which the address of the original maximum value in the table RATTAB is stored in the accumulator 172. If it is found that this requirement is not fulfilled, then the accumulator 172 is set to store $FF (block 312), and the location LASTON is set to store 0 (314), the routine thereafter proceeding to the step represented by the block 296. After the step represented by block 310, a check is made as to whether 0 is stored in the location LASTON (block 316). If it is, the accumulator 172 is set to store $FF (block 318), the routine thereafter proceeding to the final step of ROUTINE III (block 296), whereas, if it is not, the routine proceeds directly to this last-mentioned step. In this last-mentioned step, the location MINSORT is set to store the value MINRAT.

After the final step of ROUTINE III, the microprocessor 92 proceeds to the first step (block 320) of the DEBOUNCE routine in which the address in the accumulator 172 is compared with an address in a memory location CRNTON. If the compared addresses are found to be the same, the microprocessor 92 returns to the initial step (block 200) of the next scan cycle. If the compared addresses are found not to be the same, then a further comparison is made (block 322) between the address in the accumulator 172 and an address in a memory location MAYBEON. If the addresses compared in this last-mentioned comparison step are found not to be the same, the routine proceeds to the step represented by block 324 in which the address stored in the accumulator is stored in the memory location MAYBEON. Thereafter, a debounce count is set to a value CONSEC (block 326), which may typically be equal to five, and then the routine proceeds to the step represented by block 328 in which an output is produced indicative that all switches 46 are inoperative. If the addresses compared in the step represented by block 322 are found to be the same, then a determination is made (block 330) as to whether the absolute value of the difference between the maximum current data value and the maximum data value found in the last scan cycle (as stored in a memory location MAYBRAT) is less than a predetermined value JITTER. If the result of this determination is "NO", the maximum current data value is stored in the location MAYBRAT (block 332) and the routine then proceeds to the step represented by block 324. If the result of the last-mentioned determination is "YES", a check is then made as to whether the debounce count is equal to zero (block 334). If the debounce count is equal to zero, the routine proceeds to the step represented by block 336; if it is not equal to zero, the debounce count is decremented by one (block 338) and the routine then proceeds to the step represented by block 328. In the step represented by block 336, which is the final step of the DEBOUNCE routine, the location CRNTON is set to store either an indication that all switches 46 are inoperative or the address of the switch 46 confirmed by DEBOUNCE routine as being operated. It will be appreciated that for the DEBOUNCE routine to confirm a switch 46 (or in other words a key) as being operated, it is necessary for the difference between successive values of the current data for that switch to lie within predetermined limits (determined by the value JITTER) for a predetermined number of consecutive scan cycles (determined by the value CONSEC), which result will normally only be achieved if an operator's finger is resting in contact with the key area 30 corresponding to the selected switch.

Finally, the microprocessor 92 proceeds from the step represented by block 336 to an output step represented by block 340, the microprocessor thereafter returning to the initial step (block 200) of the next scan cycle. In the output step (block 340), the microprocessor produces an output on line 106 which is either indicative that all switches or keys are inoperative or which indicates to the host computer that a particular key has been operated, this being the key selected by ROUTINE III and confirmed by the DEBOUNCE routine. As previously mentioned, at the same time as an indication is sent to the host computer that a key has been operated, an audible response is produced by the sound generator 108.

In regard to the data entry system described above with reference to the drawings, it is found that the infra-red light from the LEDs 48 will in general be reflected adequately off an operator's finger, regardless of the skin tone or colour of the finger or of its degree of cleanliness. Also, it is found that the infra-red light will usually be reflected adequately off a gloved finger.

The data entry system described above has a high reliability of operation under harsh environmental conditions, and the presence of water on the panel 12 has no effect on the operation of the system. Moreover, the keyboard 20 has the advantages that it is resistant to abrasion, scratching, denting and wear; it can withstand impacts from heavy objects, it is of low cost, the panel 12 is readily replaceable; and the graphics sheet 28 is readily replaceable to suit different customer requirements. Further, the system keeps a check on the aging of the optical devices; thus, as mentioned previously, an error signal is generated if it is found that the current data value of the output of a photodiode 50 is less than half the corresponding calibration value.

While the form of the invention shown and described herein is admirably adapted to fulfill the object primarily stated, it is to be understood that it is not intended to confine the invention to the form or embodiment disclosed herein, for it is susceptible of embodiment in various other forms within the scope of the appended claims.

What is claimed is:

1. A data entry system comprising:
a sheet-like keyboard member of laminated construction of chemically toughened glass having an inner surface and an outer surface, said outer surface having a plurality of key areas respectively representative of different keys;
an array of light-emitting devices positioned adjacent said inner surface and arranged to emit light for transmission through said sheet-like member, each light-emitting device being positioned opposite a respective key area, said light-emitting devices being arranged to emit infra-red light, said light-emitting devices being mounted in individual optical support means made of a material which is opaque to infra-red light, and being arranged to emit light in a direction generally perpendicular to said inner and outer surfaces of said sheet-like member;
a plurality of light-responsive devices respectively associated with said light-emitting devices, each light-responsive device being arranged to receive light emitted by its associated light-emitting device and reflected from said sheet-like member and from an operator's finger placed in juxtaposition with the respective key area, each light-responsive device being mounted in paired relation in proximity to its corresponding light-emitting device on one of said optical support means, said optical support means being mounted on a printed circuit board which provides electrical connections to said light-emitting devices and said light-responsive devices, also including securing means for holding said printed circuit board in fixed relation with said sheet-like member;
means for successively energizing said light-emitting devices in each of a succession of scan cycles;
means for successively energizing said light-responsive devices in each scan cycle, each light-responsive device being arranged to be energized prior to the energization of the associated light emitting device;
circuit means for producing a succession of output signals in response to the energization of said light-emitting devices, each said output signal being representative of that part of the output of the respective light-responsive device due to light emitted by the associated light-emitting device and reflected back to the light-responsive device, said circuit means including an ambient light subtraction circuit to the input of which the outputs of said light-responsive devices are arranged to be applied, said light subtraction circuit including capacitor means arranged to acquire a charge during each interval between the energization of a light-responsive device and the energization of the associated light-emitting device, this charge being representative of the output of the respective light-responsive device due to ambient light, and switch means arranged to connect said input to an output portion of said light subtraction circuit via said capacitor means during each period of energization of a light-emitting device, whereby there is applied to said output portion a voltage pulse whose magnitude is dependent on the component of the output of the associated light-responsive device due to light emitted by the respective light-emitting device and reflected back to the associated light-responsive device; and
data processing means responsive to said output signals for producing an output indicative of a key operated by an operator's finger being placed in juxtaposition with the respective key area, said data processing means being arranged to store calibration data representative of the said output signal of each light-responsive device in the absence of an operator's finger being placed in proximity with the respective key area, and in which, in operation, said data processing means is arranged to generate in each scan cycle data ratios each representative of the value of said output signal of a respective light-responsive device to the respective calibration data for that device, said data processing means being arranged to produce an output indicative of an operated key on the basis of an evaluation of said data ratios.

2. A data entry system according to claim 1, in which said data processing means is arranged to generate an error signal if the data ratio in respect of any one of said light-responsive devices is less than a predetermined fraction.

3. A data entry system according to claim 1, in which said key areas are arranged in rows and columns, and in which said data processing means is arranged to produce no output indicative of an operated key in any scan cycle in which data ratios greater than a predetermined minimum are generated in respect of light-responsive devices corresponding to more than two key areas in the same row.

4. A data entry system according to claim 1, in which said key areas are arranged in rows and columns, the light-responsive devices being arranged to be energized in succession in a scan cycle row by row commencing with devices corresponding to a first row of key areas and ending with devices corresponding to a last row, and in which said data processing means is arranged, in a scan cycle, to ascertain on a row by row basis if there has been generated in respect of a light-responsive device a data ratio greater than a predetermined minimum as being a possible indication of operation of the corresponding key, but being arranged, once such data ratio has been found, to disregard in that scan cycle any data ratio greater than said predetermined minimum generated in respect of a light-responsive device corresponding to a subsequent row of key areas.

5. A data entry system according to claim 1, in which said data processing means is arranged in each scan cycle to compare the maximum data ratio with the next highest data ratio and is arranged to generate an indication that all switches are inoperative in the event of a determination being made that said next highest data ratio differs from said maximum data ratio by less than a predetermined amount.

6. A data entry system according to claim 1, in which said data processing means is arranged to provisionally select a key as being operated, on the basis of an evaluation of said data ratios, but which is arranged to check that the difference between successive values of the said output signal of the light-responsive device corresponding to the provisionally selected key lies within predetermined limits for a predetermined number of scan cycles, prior to said data processing means producing an output indicative that the provisionally selected key has been operated.

* * * * *